(12) United States Patent
Addepalli et al.

(10) Patent No.: US 9,412,886 B2
(45) Date of Patent: Aug. 9, 2016

(54) ELECTRICAL CONTACT

(75) Inventors: Pratima V. Addepalli, Monroe, MI (US); Sreenivas Jayaraman, Holland, OH (US); Oleh P. Karpenko, Perrysburg, OH (US)

(73) Assignee: First Solar, Inc., Perrysburg, OH (US)

( * ) Notice: Subject to any disclaimer, the term of this patent is extended or adjusted under 35 U.S.C. 154(b) by 959 days.

(21) Appl. No.: 13/214,780

(22) Filed: Aug. 22, 2011

(65) Prior Publication Data

US 2012/0042929 A1 Feb. 23, 2012

Related U.S. Application Data

(60) Provisional application No. 61/375,726, filed on Aug. 20, 2010.

(51) Int. Cl.
*H01L 31/073* (2012.01)
*H01L 31/0224* (2006.01)
*H01L 31/0296* (2006.01)
*H01L 31/0392* (2006.01)
*H01L 31/048* (2014.01)
*H01L 31/18* (2006.01)

(52) U.S. Cl.
CPC .... *H01L 31/022425* (2013.01); *H01L 31/0296* (2013.01); *H01L 31/022466* (2013.01); *H01L 31/0392* (2013.01); *H01L 31/048* (2013.01); *H01L 31/073* (2013.01); *H01L 31/1836* (2013.01); *H01L 31/1884* (2013.01); *Y02E 10/543* (2013.01)

(58) Field of Classification Search
CPC . H01L 31/00; H01L 31/0272; H01L 31/0336; H01L 31/03365; H01L 31/0248; H01L 31/0256; H01L 31/0224; H01L 31/022425; H01L 31/04; H01L 31/0445; H01L 31/068; H01L 31/02; H01L 31/0216; H01L 31/0296; H01L 31/042
See application file for complete search history.

(56) References Cited

U.S. PATENT DOCUMENTS

| | | | |
|---|---|---|---|
| 3,520,732 A * | 7/1970 | Shiraishi et al. | 136/258 |
| 6,077,722 A | 6/2000 | Jansen et al. | |
| 6,251,701 B1 * | 6/2001 | McCandless | 438/95 |
| 2003/0041894 A1 | 3/2003 | Sverdrup, Jr. et al. | |
| 2006/0033160 A1 * | 2/2006 | Findikoglu et al. | 257/347 |
| 2007/0000537 A1 * | 1/2007 | Leidholm et al. | 136/252 |
| 2008/0308148 A1 | 12/2008 | Leidholm et al. | |
| 2009/0235986 A1 * | 9/2009 | Hotz et al. | 136/260 |
| 2010/0180935 A1 | 7/2010 | Chen | |

(Continued)

FOREIGN PATENT DOCUMENTS

JP 53-54996 A 5/1978

OTHER PUBLICATIONS

C. S. Ferekides et al., "RF Sputtered Back Contacts for CdTe/CdS Thin Film Solar Cells," 26th IEEE Photovoltaic Specialists Conference—1997, PVSC '97 Anaheim, CA, Sep. 29-Oct. 3, 1997. pp. 423-426.

(Continued)

*Primary Examiner* — Christina Chern
(74) *Attorney, Agent, or Firm* — Dickstein Shapiro LLP

(57) ABSTRACT

A photovoltaic device with a low-resistance stable electrical back contact is disclosed. The photovoltaic device can have a $CuTe_x$ or $CuTe_xN_y$ layer.

28 Claims, 3 Drawing Sheets

(56) References Cited

U.S. PATENT DOCUMENTS

2010/0212730 A1   8/2010  Sankin
2011/0061736 A1   3/2011  Addepalli et al.
2011/0139245 A1*  6/2011  Frey et al. .................... 136/260

OTHER PUBLICATIONS

X. Wu et al., "13.9%-Efficient CdTe Polycrystalline Thin-Film Solar Cells with an Infrared Transmission of ~ 50%," Progress in Photovoltaics: Research and Applications, vol. 14, pp. 471-483, 2006.

* cited by examiner

ELECTRICAL CONTACT

CLAIM FOR PRIORITY

This application claims priority under 35 U.S.C. §119(e) to Provisional U.S. Patent Application Ser. No. 61/375,726, filed on Aug. 20, 2010, which is hereby incorporated by reference in its entirety.

TECHNICAL FIELD

This invention relates to a photovoltaic device and methods of making a photovoltaic device.

BACKGROUND

Electrical contact can be made to a photovoltaic device using a back contact layer, which can include metal. Forming a reliable and stable low resistance contact to the photovoltaic device can impact device performance.

DETAILED DESCRIPTION

Figure 1:
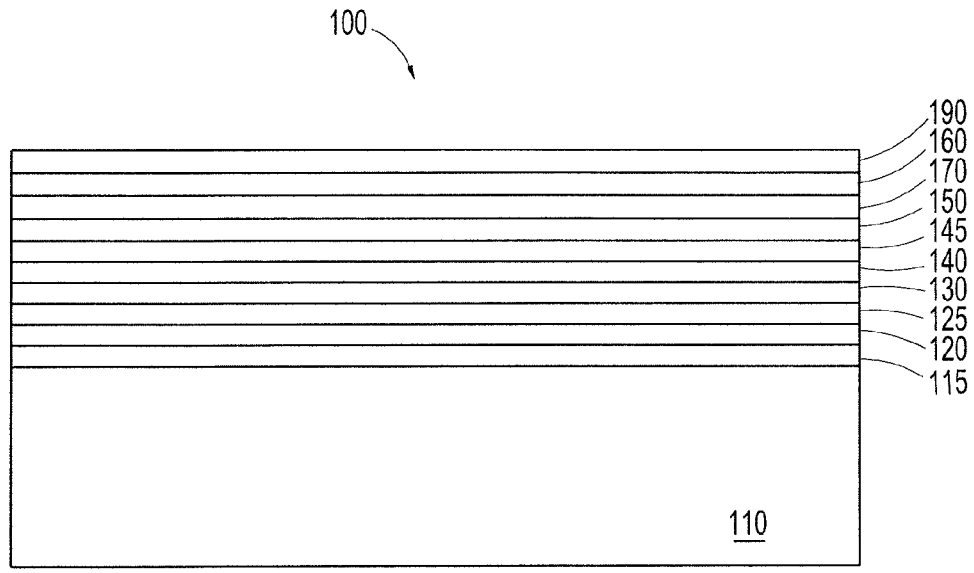
FIG. 1 is a diagram illustrating a photovoltaic device.

Photovoltaic (PV) cells can include multiple layers created on a substrate (or superstrate). For example, a photovoltaic cell can include a first barrier layer at the substrate/TCO interface, a transparent conductive oxide (TCO) layer, a first buffer layer (to the TCO layer), and a semiconductor layer formed in a stack on a substrate. Each layer may in turn include more than one sublayer or film. For example, the semiconductor layer can include a first film including a semiconductor window layer, such as a cadmium sulfide layer, formed on the first buffer layer and a second film including a semiconductor absorber layer, such as a cadmium telluride layer formed on the semiconductor window layer. The photovoltaic cell can also include a bulk-conductor layer, such as a metal back contact layer, adjacent the semiconductor absorber layer and on a side of the absorber layer opposite the substrate. Each layer can cover all or a portion of the cell and/or all or a portion of the layer or substrate underlying the layer. For example, a "layer" can include any amount of any material that contacts all or a portion of a surface.

Photovoltaic modules can include a plurality of photovoltaic cells to convert light to electric power. Cadmium telluride (CdTe) has been a desirable semiconductor material for solar cell absorber layer because of its optimal band structure and low manufacturing cost. The metallic back contact adjacent to CdTe surface can result in a back-contact barrier that limits current flow. There can be a limited choice of economical high work-function materials that can form an ohmic contact.

Moreover, the electronic properties of CdTe, especially polycrystalline CdTe which is often used in thin-film photovoltaic devices, can make it difficult to dope with an extrinsic dopant. A photovoltaic device having an improved bulk-conductor (e.g, back contact) and related manufacturing method is described to provide enhanced device performance. The manufacturing process can result in better CdTe devices by independent control of the back-contact layer though intelligent engineering of the device stack.

In some current photovoltaic device manufacturing processes, a Cu layer is applied by wet-chemical means (e.g. treatment in $CuCl_2$ solution), or dry-methods (direct sputtering or evaporation of Cu) to the back-contact surface. This can be followed by application of other metals (Mo, Ni, Pt, Al etc) that serve as current conductors. Cu application has a dual role. While a significant fraction of the Cu diffuses into CdTe in a subsequent heat-treatment step doping the CdTe p-type, a large fraction of the copper remains at the back contact. It can possibly passivate the defects and also degenerately dope the semiconductor locally affording a low-resistance contact. The single step approach makes it inherently difficult to optimize the device—i.e., to get a good back contact and optimal bulk doping. One of the key challenges with this approach is that the Cu remaining at the back interface is not bound and may further diffuse into the device resulting in a rectifying behavior at the back contact and potentially increased recombination of light generated electrons and holes and excess diffusion occur.

In some other photovoltaic device manufacturing processes, wet-chemical approaches (Brominated-Methanol, Nitric-Phosphoric etch) are used to first render the back surface rich in Te ($CdTe_{1+\delta}$). The Te-rich layer can also help with p-type doping of the back contact. This can be followed by the application of Cu containing layer by sputtering, evaporation or the use of a conductive-paint (Copper mixed with graphite or some organic compound). A thermal anneal step can follow wherein the copper is diffused into the device. $CuTe_x$ compounds can be formed. Some compositions of $CuTe_x$ can provide a good back-contact and improve overall device performance. However, in this approach, bulk doping relies on the fact that there is some free copper available to diffuse. It can be difficult to control the relative amount of 'free' and 'bound' copper.

While the aforementioned approaches have demonstrated good devices, the process of combining bulk doping and back contact formation in a single step renders the manufacturing process inflexible. Precise control of surface stoichiometry and texture is necessary to reproduce good device results. Relative ratios of Cu and Te and subsequent thermal treatment determine the precise $CuTe_x$ compound formed. The choice of process parameters that are optimum for $CuTe_x$ formation may not be what is needed to drive the copper into the bulk and activate it. Optimizing the latter can compromise the quality of the back contact, which has direct bearing on the subsequent stability and reliability of the device. For example, excess free copper has been widely reported to diffuse under light-bias and degrade the p-n junction that is at the heart of the device.

A CdTe device with a low resistance stable electrical back contact can be achieved by directly applying a Cu—Te compound with a pre-determined composition. The compound can be of stoichiometry $CuTe_x$ or $CuTe_xN_y$. In some embodiments, the $CuTe_x$ or $CuTe_xN_y$ layer can be preceded by a thin buffer layer of any suitable material that can serve to mitigate copper out-diffusion while not completely blocking it. In some embodiments, $CuTe_x$ or $CuTe_xN_y$ layer can be followed by the application of a diffusion barrier layer including but not limited to materials like Ta, W, Ru, $MoN_x$, $TiN_x$, $HfN_x$, $ZrN_x$, $TaN_x$, $WN_x$, $TiB_x$, $HfB_x$, $ZrB_x$, TaBx or combinations thereof. The latter serves to preserve the integrity of $CuTe_x$ by preventing inter-diffusion of the $CuTe_x$, or $CuTe_xN_y$ with layers above that may include aluminum, nickel or gold.

The key advantage of this approach is that the Cu doping at the back contact will be bound in a relatively stable phase and should not diffuse excessively with further light exposure or electrical stress.

In all the other available approaches, there is no attempt to directly deposit the low-resistance $CuTe_x$, compound of interest directly onto a CdTe device. However, according to embodiments described herein, a $CuTe_x$ compound is directly applied controllably and reproducibly. This allows the segmentation of the back contact processing and optimization from the main-junction optimization. Depositing $CuTe_x$ in a reactive nitrogen ambient (Nitrogen plasma or reactive gas like ammonia) can result in $CuTe_xN_y$. Nitrogen is a p-type dopant for CdTe and such a material can also result in a device with good operational and stability characteristics. Directly depositing a layer of needed stoichiometry where copper is appropriately bound can also improve device stability.

A buffer layer preceding the $CuTe_x$ layer can result in good device properties without the risk of excess copper out-diffusing from $CuTe_x$, during any subsequent high-temperature process steps. Bulk doping can be achieved independent of $CuTe_x$, application in a separate process step by using a thin layer of copper through other means e.g. sputtering, evaporation, $CuCl_2$ solution treatment. This copper is not bound and is relatively free to diffuse.

The $CuTe_x$, or $CuTe_xN_y$ formation can be followed by the formation of a diffusion barrier layer that is from a known class of such materials including but not limited to Ta, W, Ru, $MoN_x$, $TiN_x$, $HfN_x$, $ZrN_x$, $TaN_x$, $WN_x$, $TiB_x$, $HfB_x$, $ZrB_x$, TaBx or combinations thereof. This layer can prevent any detrimental interaction between the $CuTe_x$ or $CuTe_xN_y$ layer and adjacent or near by current-carrying layers like aluminum or nickel or gold.

Figure 2:
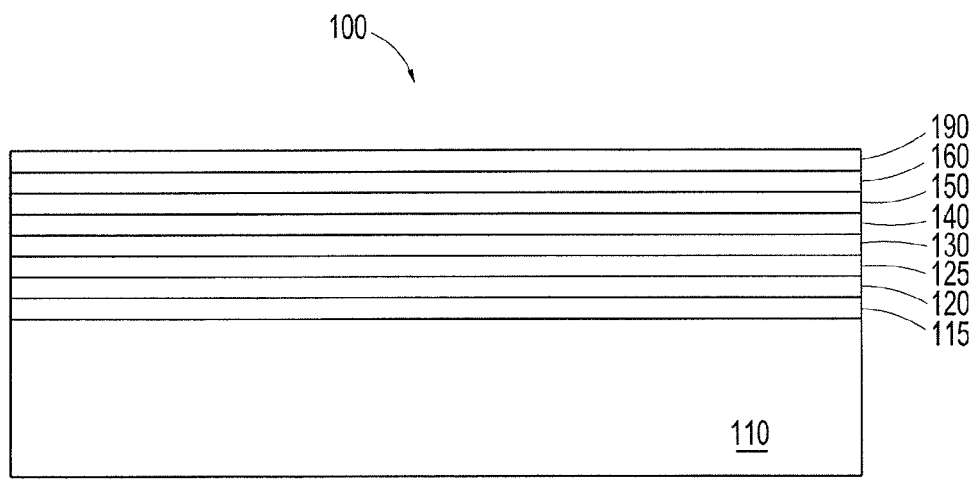
FIG. 2 is a diagram illustrating a photovoltaic device.
Figure 3:
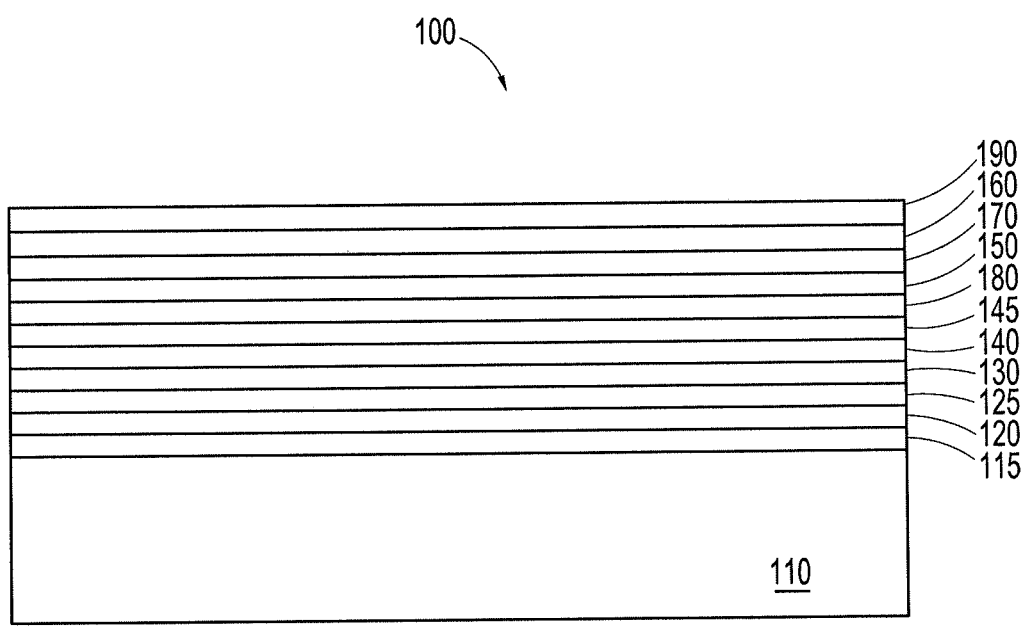
FIG. 3 is a diagram illustrating a photovoltaic device.

In one aspect, referring to FIGS. 1-3, a method for manufacturing a photovoltaic device 100 can include forming a first barrier layer 115 adjacent a substrate 110, which may be glass. The first barrier layer 115 can be chosen to lessen diffusion of sodium or other contaminants from the substrate to the semiconductor layers (130, 140), which could result in degradation and delamination. The first barrier layer 115 can be transparent, thermally stable, with a reduced number of pin holes and having high sodium-blocking capability and good adhesive properties. The first barrier layer 115 can include one or more of silicon oxide, aluminum-doped silicon oxide or silicon oxynitride, boron-doped silicon oxide, phosphorous-doped silicon oxide, silicon nitride, aluminum-doped silicon nitride, boron-doped silicon nitride, phosphorous-doped silicon nitride, silicon oxide-nitride, titanium oxide, niobium oxide, tantalum oxide, aluminum oxide, zirconium oxide, or tin oxide. The first barrier layer 115 may be formed or deposited on the TCO layer 120 using any suitable method, including, for example, sputtering or chemical vapor deposition, and may be formed to any suitable thickness.

The method can further include forming a transparent conductive oxide layer 120 adjacent the substrate 110 and first barrier layer 115. The transparent conductive oxide layer 120 can include cadmium stannate, cadmium oxide, indium oxide, cadmium indium oxide, tin oxide, zinc oxide, and/or zinc tin oxide.

First buffer layer 125 may be formed or deposited using any suitable method, including, for example, sputtering or chemical vapor deposition, and may have any suitable thickness, including, for example, more than about 10 nm, more than about 20 nm, more than about 50 nm, more than about 100 nm, more than about 150 nm, less than about 500 nm, less than about 300 nm, less than about 250 nm, or less than about 200 nm. First buffer layer 125 is formed of any suitable material, including, for example, tin oxide, zinc oxide, zinc tin oxide, indium oxide, titanium oxide, niobium oxide, tantalum oxide and silicon nitride.

The method can include forming a semiconductor window layer 130 adjacent the transparent conductive oxide layer 120. The semiconductor window layer 130 can include cadmium sulfide. A semiconductor absorber layer 140 is formed adjacent to the window layer 130. The semiconductor absorber layer 140 can include cadmium telluride. Window layer 130 and absorber layer 140 may be formed using any suitable deposition technique, including, for example, vapor transport deposition.

The method also includes forming a low-resistance contact layer 150 adjacent to the semiconductor absorber layer 140. The low-resistance contact layer 150 is selected to provide a low resistance ohmic contact between the cadmium telluride and the adjacent bulk-conductor 160. The low-resistance contact layer 150 can include copper telluride and/or copper telluride nitride.

The copper telluride of the low-resistance contact layer 150 can have a formula of $CuTe_x$, wherein x is in the range of 0.4 to 1. The copper telluride nitride of the low-resistance contact layer 150 can have a formula of $CuTe_xN_y$, wherein x is in the range of 0.4 to 1 and y is in the range of 0.01 to 1. The low-resistance contact layer 150 can have a thickness in the range of about 5 angstrom to about 1000 angstrom.

The step of providing the low-resistance contact layer 150 can include a sputtering or laser ablation to deposit copper telluride from a Cu—Te alloyed or compound target; a sputtering with a gas such as helium, neon, argon, krypton, xenon and/or nitrogen; a co-evaporation from copper and tellurium sources; a chemical vapor deposition or atomic layer deposition from copper and tellurium precursors; a chemical vapor deposition from copper and tellurium precursors with a gas such as argon, nitrogen, hydrogen, ammonia, trimethylamine, methane and/or ethane; a sputtering in a reactive gas such as hydrogen, methane, ammonia, ethane, acetylene and/or ethylene; or electro-chemical deposition of copper telluride.

In some embodiments, depositing a $CuTe_x$ (0.2<x<1) or $CuTe_xN_y$ (0.2<x<1, y<0.1) layer (low-resistance contact layer 150) of thickness about 5 to about 1000 angstrom as a contact layer on CdTe (semiconductor absorber layer 140) can include following deposition processes and techniques:

1) Physical Vapor Deposition (PVD) using methods like sputtering or laser ablation from a Cu—Te alloyed or compound target;
2) Physical Vapor Deposition using methods like sputtering where the gas ambient may include gases like He, Ne, Ar, Kr, Xe, and $N_2$;
3) Co-evaporation from Cu and Te sources;
4) Chemical Vapor Deposition or Atomic Layer Deposition from Copper and Tellurium Precursors;
5) Chemical Vapor Deposition from Copper and Tellurium Precursors where the ambience may include Ar, $N_2$, $H_2$, $NH_3$, trimethylamine, $CH_4$, and $C_2H_6$;
6) Reactive physical vapor deposition—using deposition techniques such as sputtering in a reactive gas ambient such as $H_2$, $CH_4$, $NH_3$, $C_2H_6$, $C_2H_2$, and $C_2H_4$;
7) Electro and electro-less chemical deposition;
and 8) a plating deposition of copper telluride.

The method further includes forming a bulk-conductor layer 160, such as a metal back contact layer, adjacent to the low-resistance contact layer 150. Bulk-conductor layer 160 may include any suitable material, including, for example, molybdenum and may be deposited using any suitable deposition technique, including, for example, sputtering.

A back support 190 is deposited adjacent to bulk-conductor layer 160. Back support 190 may include any suitable material, including, for example, a glass (e.g., a soda-lime glass).

Referring to FIGS. 1 and 3, the method can optionally further include forming a second barrier layer 170 (a diffusion barrier layer) between the bulk-conductor layer 160 and the low-resistance contact layer 150. The second barrier layer 170, between the bulk-conductor layer 160 and the low-resistance contact layer 150, can have a thickness in the range of about 10 angstrom to about 1000 angstrom; about 50 angstrom to about 200 angstrom; about 10 angstrom to about 750 angstrom; about 10 angstrom to about 500 angstrom; about 50 angstrom to about 500 angstrom; or other ranges more specifically within any of the foregoing. The second barrier layer 170 can include at least one material including Ta, W, Ru, $MoN_x$, $TiN_x$, $HfN_x$, $ZrN_x$, $TaN_x$, $WN_x$, $TiB_x$, $HfB_x$, $ZrB_x$, $TaB_x$ and/or any combination, where x is 0.2 to 1. The step of providing the second barrier layer 170 can include a deposition process such as sputtering, evaporation, laser ablation, and/or wet-chemical processing.

In addition, the method can optionally further include forming a second buffer layer 145 as shown in FIGS. 1 and 3. The second buffer layer 145 can be formed by any suitable technique of any suitable material that can serve to mitigate copper out-diffusion while not completely blocking it.

Referring to FIG. 3, the method can also optionally include forming a copper diffusion source layer 180 between the semiconductor absorber layer 140 and the low-resistance contact layer 150. Copper diffusion source layer 180 can be any suitable copper containing material to provide a source of copper for diffusion. The step of providing the copper diffusion source layer 180 can include a deposition process, such as sputtering, chemical vapor deposition, roll-application, ink-jet spray, and laser ablation. The copper diffusion source layer 180 can have a thickness in the range of about 5 angstrom to about 100 angstrom.

With the above-disclosed manufacturing approach, and referring again to FIG. 1, photovoltaic device 100 can include substrate 110, first barrier layer 115, transparent conductive oxide layer 120, first buffer layer 125, semiconductor window layer 130, semiconductor absorber layer 140, second buffer layer 145, low-resistance contact layer 150, second barrier layer 170, bulk conductor layer 160, and back support 190.

Semiconductor absorber layer 140 can include cadmium telluride (CdTe) or copper indium gallium diselenide (CIGS), or any other suitable absorber material. Semiconductor window layer 130 can include cadmium sulfide.

Low-resistance contact layer 150 can include at least one compound such as $CuTe_x$ (0.2<x<1) or $CuTe_xN_y$ (0.2<x<1, y<0.1). While Cu is needed to dope the device 100 (e.g., the window and absorber layers 130, 140), excess copper can be detrimental to the device performance. Theories for CdTe photovoltaic degradation include counter-doping from excessive copper (Cu can also be an n-type dopant), increased carrier recombination in the main p-n junction and loss of copper from the back contact (160) (degradation of $R_{oc}$). The last mechanism can be mitigated if copper is chemically or physically bound preventing its diffusion into the bulk. However, care must be taken in binding the copper as it may be rendered electrically inactive. $CuTe_x$ (or $CuTe_xN_y$ (0.2<x<1, y<0.1)) is a p+ degenerately doped semiconductor. Binding the copper in the form of $CuTe_x$ (low-resistance contact layer 150) can potentially allow for both a low-resistance and stable contact. Direct application of a known stoichiometry of $CuTe_x$ (or $CuTe_xN_y$ (0.2<x<1, y<0.1)) enables better process control for device fabrication and eventually improved devices. Through processes like magnetron sputtering, chemical vapor deposition or atomic layer deposition, a layer of $CuTe_x$ (or $CuTe_xN_y$ (0.2<x<1, y<0.1)) (low-resistance contact layer 150) can be applied controllably with a precision down to few angstroms.

In some embodiments, referring to FIG. 2, photovoltaic device 100 can include substrate 110, first barrier layer 115, transparent conductive oxide layer 120, first buffer layer 125, semiconductor window layer 130, semiconductor absorber layer 140, low-resistance contact layer 150, bulk conductor 160, and back support 190.

In some embodiments, referring to FIG. 3, photovoltaic device 100 can include substrate 110, first barrier layer 115, transparent conductive oxide layer 120, first buffer layer 125, semiconductor window layer 130, semiconductor absorber layer 140, second buffer layer 145, copper diffusion source layer 180, low-resistance contact layer 150, second barrier layer 170, bulk-conductor 160, and back support 190.

Photovoltaic devices 100 fabricated using the methods discussed herein may be incorporated into one or more photovoltaic modules. The modules may be incorporated into various systems for generating electricity. For example, a photovoltaic cell may be illuminated with a beam of light to generate a photocurrent. The photocurrent may be collected and converted from direct current (DC) to alternating current (AC) and distributed to a power grid. Light of any suitable wavelength may be directed at the cell to produce the photocurrent, including, for example, more than 350 nm, or less than 850 nm. Photocurrent generated from one photovoltaic cell may be combined with photocurrent generated from other photovoltaic cells. For example, the photovoltaic cells may be part of one or more photovoltaic modules in a photovoltaic array, from which the aggregate current may be harnessed and distributed.

Figure 4:
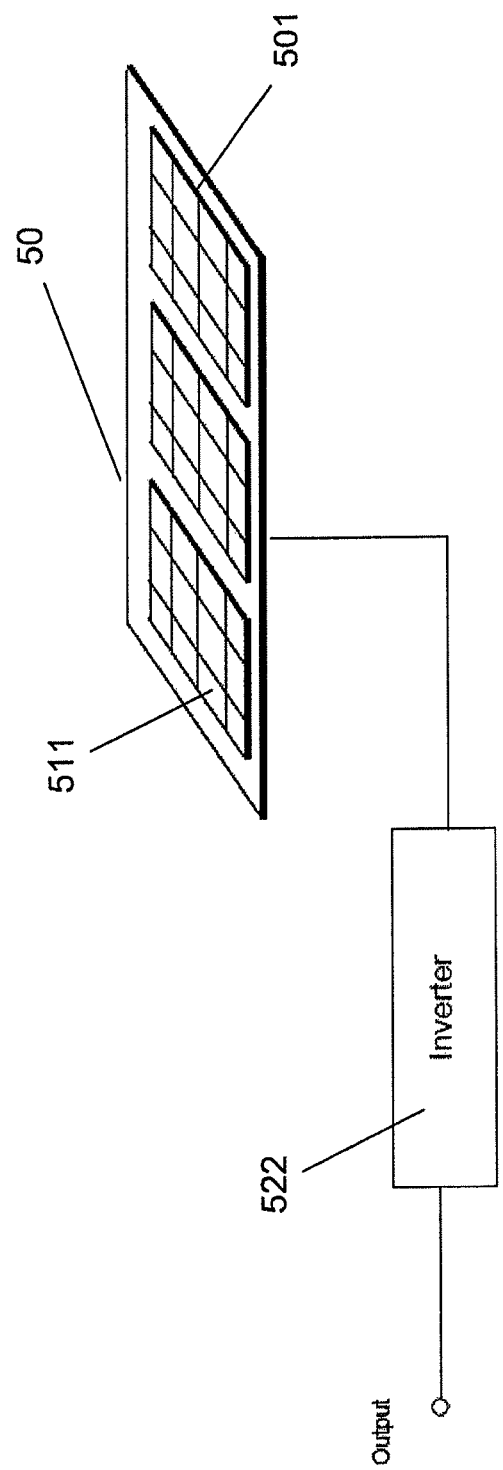
FIG. 4 is a diagram illustrating a photovoltaic array.

Referring to FIG. 4, by way of example, a photovoltaic array 50 may include one or more interconnected photovoltaic modules 501. One or more of photovoltaic modules 501 may include one or more photovoltaic cells 511 having any of the multilayer structure or photovoltaic device configurations discussed herein. Photovoltaic array 50 may be illuminated with a light source, e.g., the sun or any suitable artificial light source, to generate a photocurrent. For example, photovoltaic array 50 may be illuminated with a wavelength of light between about 400 nm to about 700 nm. The generated photocurrent may be converted from direct current (DC) to alternating current (AC) using, for example, an inverter 522. The converted current may be output for any of a variety of uses, including, for example, connection to one or more home appliances or to a utility grid.

A number of embodiments of the invention have been described. Nevertheless, it will be understood that various modifications may be made without departing from the spirit and scope of the invention. It should also be understood that the appended drawings are not necessarily to scale, presenting a somewhat simplified representation of various preferred features illustrative of the basic principles of the invention.

What is claimed is:

1. A method for manufacturing a photovoltaic module comprising:
    forming a semiconductor absorber layer over a substrate, the semiconductor absorber layer comprising cadmium telluride;
    forming a low-resistance contact layer over the semiconductor absorber layer in which copper is bound in a chemically stable phase, the low-resistance contact layer comprising a copper telluride nitride with a formula of $CuTe_xN_y$ wherein x is in the range of 0.2 to 1 and y is less than 0.1;

forming a diffusion barrier layer over the low-resistance contact layer; and forming a metal back contact layer over the diffusion barrier layer.

2. The method of claim 1, further comprising providing a copper diffusion source layer between the semiconductor absorber layer and the low-resistance contact layer.

3. The method of claim 1, further comprising providing a semiconductor window layer between the semiconductor absorber layer and the substrate.

4. The method of claim 3, wherein the semiconductor window layer comprises cadmium sulfide.

5. The method of claim 1, further comprising providing a transparent conductive oxide layer between the semiconductor absorber layer and the substrate.

6. The method of claim 5, wherein the transparent conductive oxide layer comprises at least one material selected from the group consisting of cadmium stannate, cadmium oxide, indium oxide, cadmium indium oxide, tin oxide, zinc oxide, and zinc tin oxide.

7. The method of claim 1, wherein the low-resistance contact layer has a thickness in the range of about 5 angstrom to about 1000 angstrom.

8. The method of claim 1, wherein forming the low-resistance contact layer comprises a sputtering or laser ablation to deposit copper telluride from a Cu—Te alloyed or compound target.

9. The method of claim 1, wherein forming the low-resistance contact layer comprises a sputtering with a gas ambient comprising at least one material selected from the group consisting of He, Ne, Ar, Kr, Xe, and $N_2$.

10. The method of claim 1, wherein forming the low-resistance contact layer comprises a co-evaporation from Cu and Te sources.

11. The method of claim 1, wherein forming the low-resistance contact layer comprises a chemical vapor deposition or atomic layer deposition from copper and tellurium precursors.

12. The method of claim 1, wherein forming the low-resistance contact layer comprises a chemical vapor deposition from copper and tellurium precursors with a gas ambient comprising at least one material selected from the group consisting of Ar, $N_2$, $H_2$, $NH_3$, trimethylamine, $CH_4$, and $C_2H_6$.

13. The method of claim 1, wherein providing the low-resistance contact layer comprises a sputtering in a reactive gas ambient comprising at least one material selected from the group consisting of $H_2$, $CH_4$, $NH_3$, $C_2H_6$, $C_2H_2$, and $C_2H_4$.

14. The method of claim 1, wherein providing the low-resistance contact layer comprises a plating deposition of copper telluride.

15. The method of claim 1, wherein the diffusion barrier layer has a thickness in the range of about 10 angstrom to about 1000 angstrom.

16. The method of claim 1, wherein the diffusion barrier layer comprises at least one material selected from the group consisting of Ta, W, Ru, $MoN_x$, $TiN_x$, $HfN_x$, $ZrN_x$, $TaN_x$, $WN_x$, $TiB_x$, $HfB_x$, $ZrB_x$, $TaBx$ or any combination.

17. The method of claim 1, wherein forming the diffusion barrier layer comprises a deposition process selected from the group consisting of sputtering, chemical vapor deposition, roll-application, ink-jet spray, and laser ablation.

18. The method of claim 1, wherein forming the diffusion barrier layer comprises a deposition process selected from the group consisting of sputtering, evaporation, laser ablation, and wet-chemical process.

19. The method of claim 1, further comprising forming a buffer layer between the low-resistance contact layer and the semiconductor absorber layer.

20. A photovoltaic device comprising:
a substrate;
a semiconductor absorber layer over the substrate, the semiconductor absorber layer comprising cadmium telluride;
a low-resistance contact layer over the semiconductor absorber layer in which copper is bound in a chemically stable phase, the low-resistance contact layer comprising a copper telluride nitride with a formula of $CuTe_xN_y$ wherein x is in the range of 0.2 to 1 and y is less than 0.1;
a diffusion barrier layer over the low-resistance contact layer; and
a metal back contact layer over the diffusion barrier layer.

21. The photovoltaic device of claim 20, further comprising a copper diffusion source layer between the semiconductor absorber layer and the low-resistance contact layer.

22. The photovoltaic device of claim 20, wherein the low-resistance contact layer has a thickness in the range of about 5 angstrom to about 1000 angstrom.

23. The photovoltaic device of claim 20, wherein the diffusion barrier layer has a thickness in the range of about 10 angstrom to about 1000 angstrom.

24. The photovoltaic device of claim 20, wherein the diffusion barrier layer comprises at least one material selected from the group consisting of Ta, W, Ru, $MoN_x$, $TiN_x$, $HfN_x$, $ZrN_x$, $TaN_x$, $WN_x$, $TiB_x$, $HfB_x$, $ZrB_x$, $TaB_x$ or any combination.

25. The photovoltaic device of claim 20, further comprising a buffer layer between the low-resistance contact layer and the semiconductor absorber layer.

26. A photovoltaic module comprising:
a substrate;
a plurality of photovoltaic devices formed on the substrate, wherein at least one of the photovoltaic devices comprises:
a semiconductor absorber layer over the substrate, the semiconductor absorber layer comprising cadmium telluride;
a low-resistance contact layer over the semiconductor absorber layer in which copper is bound in a chemically stable phase, the low-resistance contact layer comprising a copper telluride nitride with a formula of $CuTe_xN_y$ wherein x is in the range of 0.2 to 1 and y is less than 0.1;
a diffusion barrier layer over the low-resistance contact layer; and
a metal back contact layer over the diffusion barrier layer; and
a back support adjacent to the back contact layer.

27. The photovoltaic module of claim 26, further comprising: a buffer layer between the low-resistance contact layer and the semiconductor absorber layer; and a copper diffusion source layer between the buffer layer and the low-resistance contact layer.

28. A method for manufacturing a photovoltaic module comprising:
forming a semiconductor absorber layer over a substrate, the semiconductor absorber layer comprising cadmium telluride;
forming a copper diffusion source layer over the semiconductor absorber layer;

forming a low-resistance contact layer over the semiconductor absorber layer, the low-resistance contact layer comprising a copper telluride nitride with a formula of $CuTe_xN_y$, wherein x is in the range of 0.2 to 1 and y is less than 0.1;

forming a diffusion barrier layer over the low-resistance contact layer, wherein the diffusion barrier layer comprises at least one material selected from the group consisting of Ta, W, Ru, $MoN_x$, $HfN_x$, $ZrN_x$, $TaN_x$, $WN_x$, $TiB_x$, $HfB_x$, $ZrB_x$, $TaB_x$ or any combination; and forming a metal back contact layer over the diffusion barrier layer.

* * * * *